United States Patent
Matsunami

(10) Patent No.: US 7,452,799 B2
(45) Date of Patent: Nov. 18, 2008

(54) BALL FILM FOR INTEGRATED CIRCUIT FABRICATION AND TESTING

(75) Inventor: Akira Matsunami, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 62 days.

(21) Appl. No.: 11/421,284

(22) Filed: May 31, 2006

(65) Prior Publication Data

US 2006/0258141 A1 Nov. 16, 2006

Related U.S. Application Data

(62) Division of application No. 10/648,963, filed on Aug. 27, 2003, now Pat. No. 7,078,821.

(51) Int. Cl.
*H01L 21/44* (2006.01)

(52) U.S. Cl. .............. 438/613; 438/614; 257/E21.508

(58) Field of Classification Search .............. 438/613, 438/614; 257/E21.508
See application file for complete search history.

(56) References Cited

U.S. PATENT DOCUMENTS

| 5,219,117 | A | * | 6/1993 | Lin | 228/253 |
| 5,861,323 | A | * | 1/1999 | Hayes | 438/111 |
| 6,025,258 | A | * | 2/2000 | Ochiai et al. | 438/613 |
| 6,426,564 | B1 | * | 7/2002 | Ball | 257/783 |
| 2001/0041437 | A1 | * | 11/2001 | Cobbley et al. | 438/613 |

* cited by examiner

*Primary Examiner*—Phat X Cao
(74) *Attorney, Agent, or Firm*—Tum Thach; Wade J. Brady, III; Frederick J. Telecky, Jr

(57) ABSTRACT

According to one embodiment of the invention, a method of fabricating ball grid array packages includes providing a substrate, providing a ball film that includes a plurality of metal balls movably contained within respective slots of a thin film, coupling the metal balls to the substrate, and removing the thin film from the metal balls.

8 Claims, 3 Drawing Sheets

BALL FILM FOR INTEGRATED CIRCUIT FABRICATION AND TESTING

This is a divisional application Ser. No. 10/648,963 filed Aug. 27, 2003, U.S. Pat. No. 7,078,821 the contents of which are herein incorporated by reference in its entirety.

TECHNICAL FIELD OF THE INVENTION

This invention relates generally to the field of integrated circuit packaging and, more specifically, to a ball film for integrated circuit fabrication and testing.

BACKGROUND OF THE INVENTION

Because of the sheer volume of integrated circuits in the marketplace, packaging of integrated circuits and testing of the completed packages in a cost-effective manner is important for semiconductor manufacturers in order that they can be competitive in the marketplace. Integrated circuit packages, such as ball grid arrays, can be tricky to manufacture efficiently and the solder balls may become damaged when testing due to current testing procedures. In addition, the attachment of solder balls or bumps as they are sometimes referred to are important in keeping costs down and quality and realiability up.

SUMMARY OF THE INVENTION

According to one embodiment of the invention, a method of fabricating ball grid array packages includes providing a substrate, providing a ball film that includes a plurality of metal balls movably contained within respective slots of a thin film, coupling the metal balls to the substrate, and removing the thin film from the metal balls.

Some embodiments of the invention provide numerous technical advantages. Other embodiments may realize some, none, or all of these advantages. For example, a ball film manufactured according to the teachings of the invention may be utilized as a buffer between the solder balls of a ball grid array package and the metal contact pins of a socket during testing in order to prevent damage to the solder balls. In addition, because the balls in the ball film can freely rotate, improved contact between all solder balls and their respective contact pins is improved. In another example, a ball film may be utilized to attach solder balls to a ball grid array package substrate. This eliminates the need for a vacuum pick operation as well as increasing the quality of the solder ball attach process. In another example, a ball film may be utilized to attach gold or solder balls to bond pads on an integrated circuit chip. By using the layout of the chip mask pattern, the process may be highly accurate. This eliminates the need for mechanical wire bump operation.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1A through 5C of the drawings, in which like numerals refer to like parts.

Figure 1A:
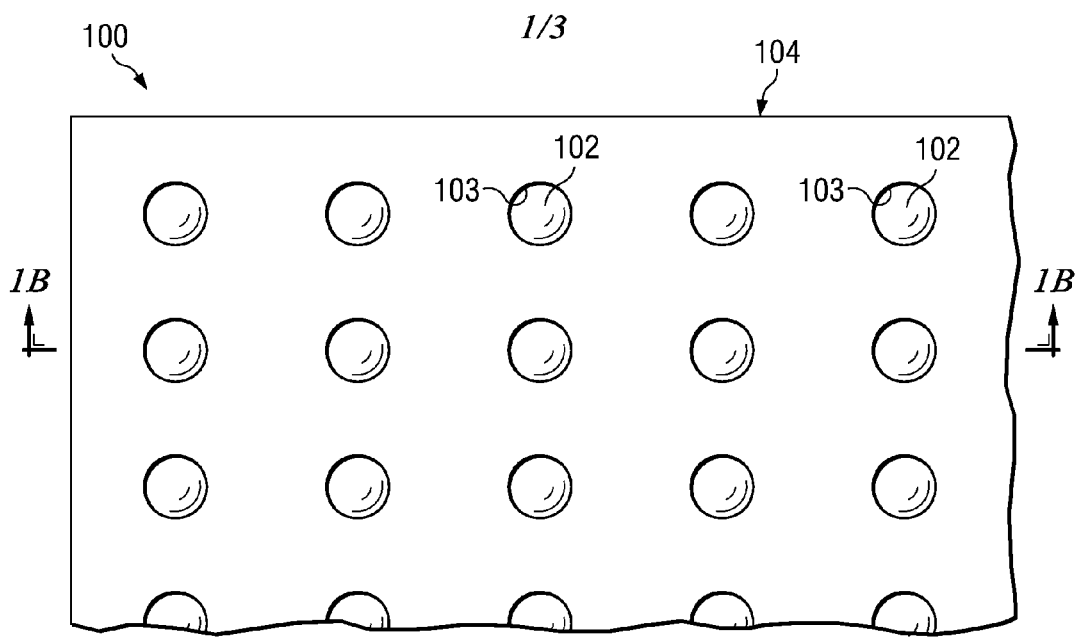
FIGS. 1A and 1B are plan and cross-sectional elevation views, respectively, of a ball film in accordance with an embodiment of the invention.
Figure 1B:
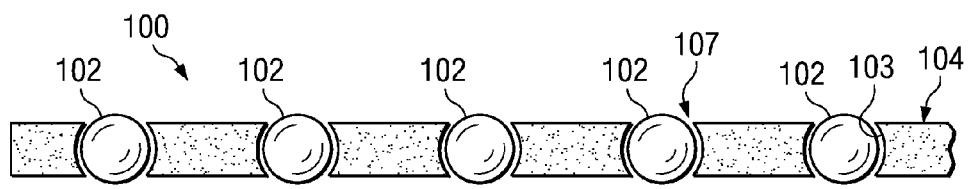

FIGS. 1A and 1B are plan and cross-sectional elevation views, respectively, of a ball film 100 in accordance with an embodiment of the invention. In the illustrated embodiment, ball film 100 includes a plurality of metal balls 102 movably contained within respective slots 103 of a thin film 104. Ball film 100 may have any suitable size and shape and may have any suitable pattern of metal balls 102. For example, metal balls 102 may be in the form of an array or may be randomly positioned. A method of forming ball film 100 is described in greater detail below in conjunction with FIGS. 2A through 2C and various functions of ball film 100 are described below in conjunction with FIGS. 3A and 3B, 4A through 4C, and 5A through 5C.

Metal balls 102 may be formed from any suitable conductive material. For example, metal balls 102 may be formed from eutectic solder, lead-free solder, gold, or other suitable conductive material. Although metal balls 102 may have any suitable size and shape, it is preferable that metal balls 102 be formed in a spherical shape with each metal ball 102 having a diameter of between 0.1 mm and 0.5 mm, depending on the application for ball film 100. Any suitable fabrication method may be utilized to form metal balls 102, such as micro machine technology. A pitch between the centerlines of metal balls 102 may be any suitable length; however, in one embodiment, the pitch between centerlines of metal balls 102 is between approximately 0.15 mm and 0.65 mm.

Thin film 104 may be any suitable size and shape and may be formed from any suitable material. In one embodiment, thin film 104 has a thickness of between 0.01 mm and 0.4 mm; however, other suitable thickness are contemplated by the present invention. In addition, thin film 104 may be formed from polyimide, a suitable organic material, and the like. Thin film 104 may also be formed from any suitable number of layers having the same or different material type. As described above, slots 103 are formed in thin film 104 in order to movably contain metal balls 102 therein. Although slots 103 may have any suitable shape, it is preferable that slots 103 have a spherical shape. In a particular embodiment of the invention, slots 103 have a spherical shape that corresponds to a spherical shape of metal balls 102. In this embodiment, as denoted more clearly in FIG. 1B, a radius of the spherical slots is larger than the radius of metal balls 102 to facilitate the movable nature of metal balls 102 within slots 103. This results in a gap 107 on either side of metal balls 102 to facilitate translational movement of metal balls 102 in addition to rotational movement of metal balls 102. The reasons for having metal balls 102 movably contained within slots 103 is described in further detail below.

Figure 2A:
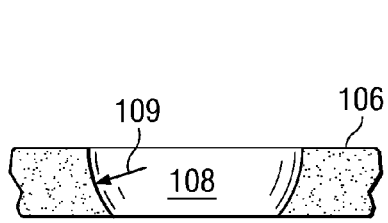
FIGS. 2A through 2C are a series of cross-sectional elevation views illustrating a method of forming the ball film of FIGS. 1A and 1B in accordance with an embodiment of the invention.
Figure 2B:
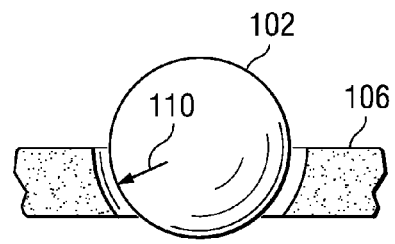
Figure 2C:
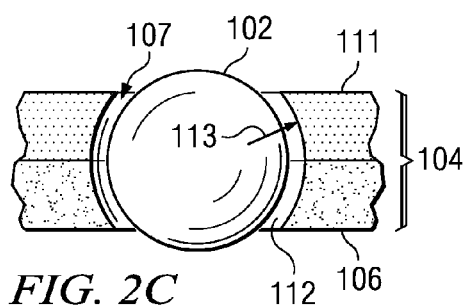

FIGS. 2A through 2C are a series of cross-sectional elevation views illustrating an example method of forming ball film 100 in accordance with an embodiment of the invention. Referring to FIG. 2A, a first thin film 106 is illustrated. First thin film 106 forms one half of thin film 104 (the "lower" half in the illustrated example). First thin film 106 has a first slot 108 formed therein. Although first slot 108 may have any suitable shape, in the illustrated embodiment, first slot 108 is spherically shaped with a wall having a particular radius 109.

Referring to FIG. 2B, the positioning of a metal ball 102 within first slot 108 is illustrated. Any suitable method may be used to position metal ball 102 within first slot 108. As illustrated in FIG. 2B, a radius 110 of metal ball 102 is smaller than radius 109 of first slot 108.

Referring to FIG. 2C, the completion of ball film 100 is illustrated by coupling a second thin film 111 to first thin film 106. Any suitable attachment method may be utilized to couple second thin film 111 to first thin film 106. Second thin film 111 includes a second slot 112 that corresponds to first slot 108 in such a manner as to form slot 103 of thin film 104. In the illustrated embodiment, second slot 112 is spherically shaped and is essentially a mirror image of first slot 108 in order to form spherically shaped slot 103. In addition, second slot 112 has a radius 113 substantially equal to radius 109 of first slot 108. This facilitates gap 107, as described above. This facilitates the movable nature of metal ball 102 within slot 103 because metal ball 102 has a smaller diameter 110. As described above, metal ball 102 is both translationally and rotatably contained within slot 103. This ends the example method as outlined in FIGS. 2A through 2C.

As described above, ball film 100 may be utilized in many different applications. Three such applications are described below in conjunction with FIGS. 3A and 3B, 4A through 4C, and 5A through 5C.

Figure 3A:
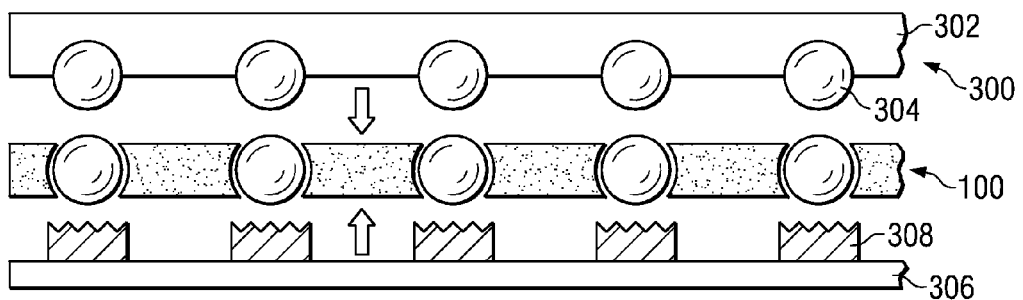
FIGS. 3A and 3B are elevation views illustrating a method of testing a ball grid array package utilizing a ball film in accordance with an embodiment of the invention.
Figure 3B:
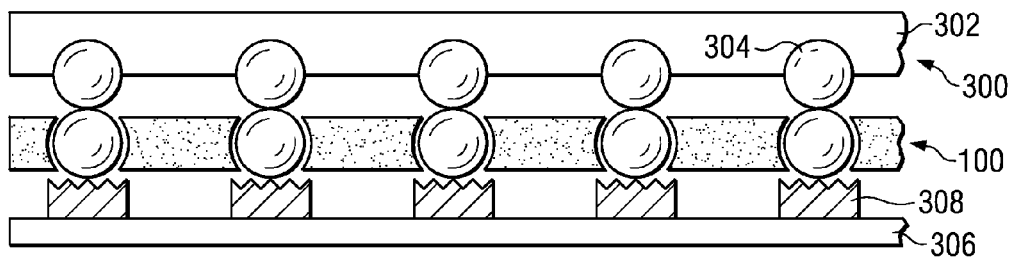

FIGS. 3A and 3B are elevation views illustrating a method of testing a ball grid array package 300 utilizing ball film 100 in accordance with an embodiment of the invention. In the illustrated embodiment, ball grid array package 300 includes a substrate 302 having a plurality of solder balls 304 coupled thereto. Ball grid array package 300 is to be tested with a contact board 306 having a plurality of metal contact pins 308. Metal contact pins 308 are typically arranged in a pattern that matches a pattern of solder balls 304. In current methods of testing ball grid array packages, the solder balls of the ball grid array package directly contact the metal contact pins of the contact board during testing. This sometimes damages the solder balls of the ball grid array package because of various factors, such as the pressure exerted on the contact pins in addition to any offset between any particular solder ball and metal contact pin. To alleviate this problem, ball film 100 is positioned between ball grid array package 300 and contact board 306 in such a manner that each metal ball 102 of ball film 100 is positioned between a respective solder ball 304 and a respective metal contact pin 308 to act as a buffer. Because of the movable nature of metal balls 102 within slots 103 of thin film 104, pressure exerted against solder balls 304 of ball grid array package 300 is alleviated and the potential of damaging the solder balls 304 is substantially reduced or eliminated. Any damage that may occur is received by metal balls 102 of ball film 100.

Figure 4A:
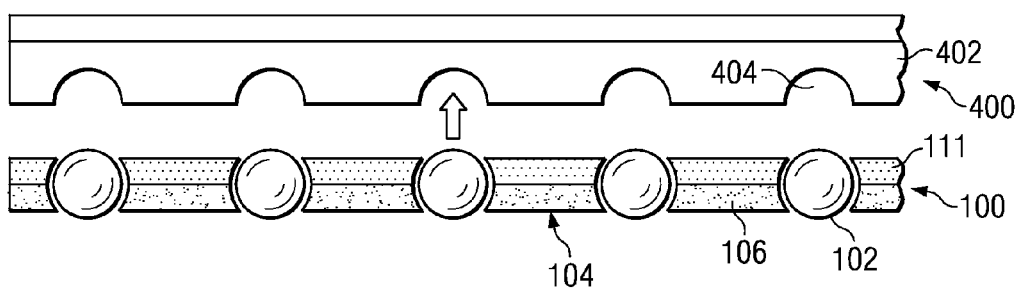
FIGS. 4A through 4C are elevation views illustrating a method of coupling solder balls to a ball grid array package substrate utilizing a ball film in accordance with an embodiment of the invention.
Figure 4B:
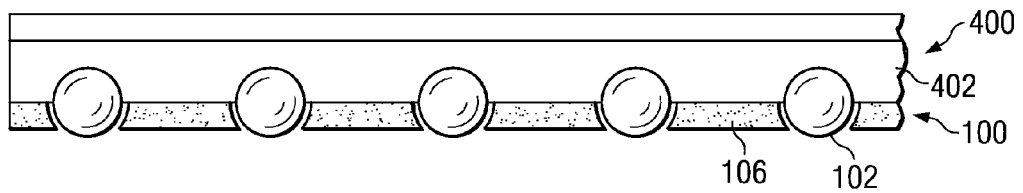
Figure 4C:
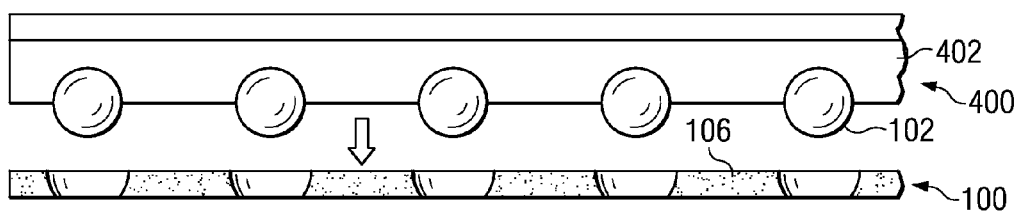

FIGS. 4A through 4C are elevation views illustrating a method of coupling solder balls to a ball grid array package 400 utilizing ball film 100 in accordance with an embodiment of the invention. As illustrated in FIG. 4A, ball grid array package 400 includes a substrate 402 having a plurality of slots 404 formed therein. Although slots 404 may have any suitable size and shape, it is preferable that the size and shape of slots 404 match up with the size and shape of metal balls 102 of ball film 100. In addition, the pattern of slots 404 should be arranged in such a manner that it matches the pattern of metal balls 102 of ball film 100.

Referring to FIG. 4B, ball film 100 is engaged in substrate 402 of ball grid array package 400 such that metal balls 102 are coupled to slots 404. Any suitable coupling method may be utilized. Metal balls 102 will become the solder balls for ball grid array package 400. Accordingly, referring to FIG. 4C, in order to complete the attachment of the solder balls to ball grid array package 400, thin film 104 of ball film 100 is removed from metal balls 102, while keeping metal balls 102 coupled to substrate 402 of ball grid array package 400. Any suitable removal method may be utilized to remove thin film 104.

Figure 5A:
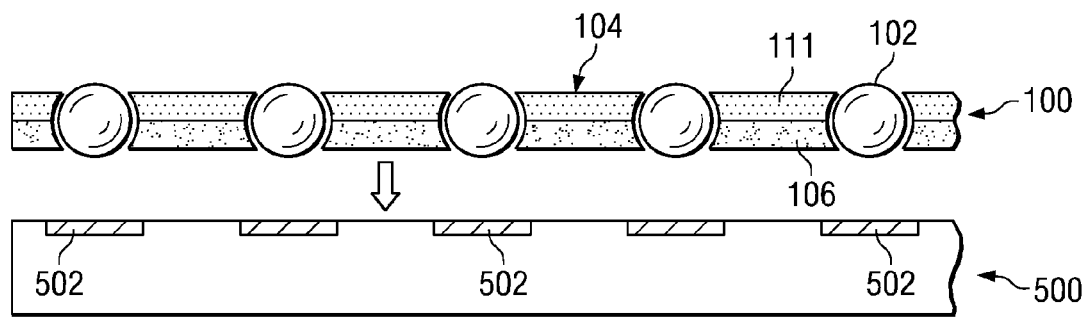
FIGS. 5A through 5C are elevation views illustrating a method of coupling gold balls to a integrated circuit chip utilizing a ball film in accordance with an embodiment of the invention.
Figure 5B:
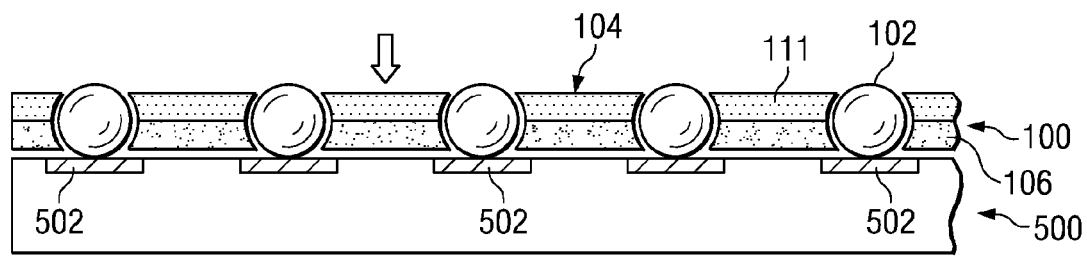
Figure 5C:
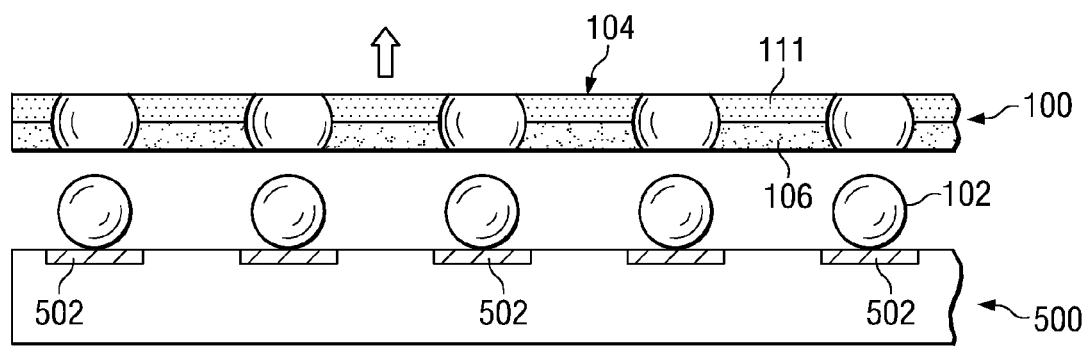

FIGS. 5A through 5C are elevation views illustrating a method of coupling gold bumps to an integrated circuit chip 500 utilizing ball film 100 in accordance with an embodiment of the invention. Integrated circuit chip 500 includes a plurality of bond pads 502 formed from any suitable material and arranged in any suitable pattern. In this example, it is desired to attach gold bumps to bond pads 502. This may be done using ball film 100 having metal balls 102 that are formed from gold. The pattern of metal balls 102 substantially match the pattern of bond pads 502 on integrated circuit chip 500. The pattern for metal balls 102 may be based upon the chip mask for integrated circuit chip 500 in order to get an accurate pattern.

Referring to FIG. 5B, metal balls 102 are illustrated as being coupled to bond pads 502. This may be accomplished using any suitable method. To complete the attaching of the gold bumps, thin film 104 is removed from metal balls 102, as illustrated in FIG. 5C. Any suitable removal method may be utilized to remove thin film 104.

Thus, ball film 100 manufactured according to the teachings of the invention may be utilized in many different applications, such as a buffer between the solder balls of a ball grid array package and the metal contact pins of a socket during testing in order to prevent damage to the solder balls, as well as to attach solder balls to a ball grid array package substrate. This eliminates the need for a vacuum pick operation as well as increasing the quality of the solder ball attach process. Ball film 100 may be utilized to attach gold or solder bumps to bond pads on an integrated circuit chip. By using the layout of the chip mask pattern, the process may be highly accurate. This eliminates the need for mechanical wire bump operation. Other suitable applications are contemplated by the present invention.

Although embodiments of the invention and their advantages are described in detail, a person skilled in the art could make various alterations, additions, and omissions without departing from the spirit and scope of the present invention, as defined by the appended claims.

What is claimed is:

1. A method of fabricating ball grid array packages, comprising:
   providing a substrate;
   providing a ball film, the ball film comprising a plurality of metal balls each movably contained within a respective one of a plurality of slots of a thin film having a first thin film and second thin film, and each slot having a first opening with a first diameter on the first thin film and a second opening with a second diameter on the second thin film, a side wall including a portion of a sphere with a diameter greater than the first and the second diameter;
coupling the metal balls to the substrate; and
removing the thin film from the metal balls.

2. The method of claim 1, wherein providing a substrate comprises providing the substrate with a plurality of slots formed therein, and wherein the metal balls are arranged in a pattern that matches the pattern of the slots formed in the substrate.

3. The method of claim 1, wherein providing a substrate comprises providing an integrated circuit chip having a plurality of bond pads formed thereon, and wherein the metal balls are arranged in a pattern that matches the pattern of the bond pads formed on the integrated circuit chip.

4. The method of claim 3, wherein the metal balls are formed from solder.

5. The method of claim 3, wherein the metal balls are formed from gold.

6. The method of claim 1, wherein the thin film is formed from polyimide.

7. The method of claim 1, further comprising providing the first and second thin films each with a thickness of between 0.01 mm and 0.4 mm.

8. The method of claim 1, further comprising providing the metal balls each with a diameter of between 0.1 mm and 0.5 mm.

* * * * *